United States Patent [19]

Reich

[11] Patent Number: 4,935,741

[45] Date of Patent: Jun. 19, 1990

[54] DIGITAL-TO-ANALOG CONVERTER WITH CYCLIC CONTROL OF CURRENT SOURCES

[75] Inventor: Werner Reich, Emmendingen, Fed. Rep. of Germany

[73] Assignee: Deutsche ITT Industries GmbH, Freiburg, Fed. Rep. of Germany

[21] Appl. No.: 272,966

[22] Filed: Nov. 18, 1988

[30] Foreign Application Priority Data

Dec. 10, 1987 [EP] European Pat. Off. ........ 87118298.6

[51] Int. Cl.$^5$ ............................................. H03M 1/76
[52] U.S. Cl. .................................. 341/150; 341/144; 341/153; 341/154
[58] Field of Search ................. 341/63, 138, 140, 144, 341/146, 150, 153, 154

[56] References Cited

U.S. PATENT DOCUMENTS

| | | |
|---|---|---|
| 3,831,167 | 8/1974 | Tewksbury .......................... 341/144 |
| 3,911,427 | 10/1975 | Schlichte ............................ 341/150 |
| 3,982,172 | 9/1976 | van de Plassche . | |
| 4,225,816 | 9/1980 | Schade . | |
| 4,521,764 | 6/1985 | Burton ............................... 341/154 |
| 4,703,310 | 10/1987 | van de Plassche . | |

FOREIGN PATENT DOCUMENTS

| | | |
|---|---|---|
| 0135274 | 7/1984 | European Pat. Off. . |
| 0170493 | 2/1986 | European Pat. Off. . |
| 2349874 | 11/1977 | France . |
| 2080059 | 1/1982 | United Kingdom . |

OTHER PUBLICATIONS

P. E. Danielsson, "The Glitch-Free D/A Converter," *Digital Processes*, 5, 1979, pp. 122-140.
R. J. v. d. Plassche, "Monolithic 14-Bit DAC with 85 dB S/n Ratio," *Electronic Components and Applications*, vol. 2, No. 4, Aug. 1980, pp. 235-241.
Rudy van de Plassche, "Dynamic Element Matching Puts Trimless Converters on Chip," Electronics, Jun. 16, 1983, pp. 130-134.

*Primary Examiner*—William M. Shoop, Jr.
*Assistant Examiner*—Gary J. Romano
*Attorney, Agent, or Firm*—Thomas L. Peterson

[57] ABSTRACT

In digital-to-analog converters with "rotating" current sources for converting an n-bit binary signal to an analog output signal, a single cyclic shift register is replaced by m cyclic shift register portions each having $p = (2^n - 1)/m$ inputs, and the n-digit binary signal to be converted is changed into the thermometer code by means of a code converter. The middle output of the code converter and equal numbers of code converter outputs on both sides thereof are connected to one of the shift register portions. According to the same rule, the code converter outputs located further from the middle are connected to the other shift register portions. Thus, a clock signal serving as a shift signal for the shift register portions only needs to have a frequency which is p times that of the sampling signal with which an, e.g., analog, audio signal is digitized.

3 Claims, 1 Drawing Sheet

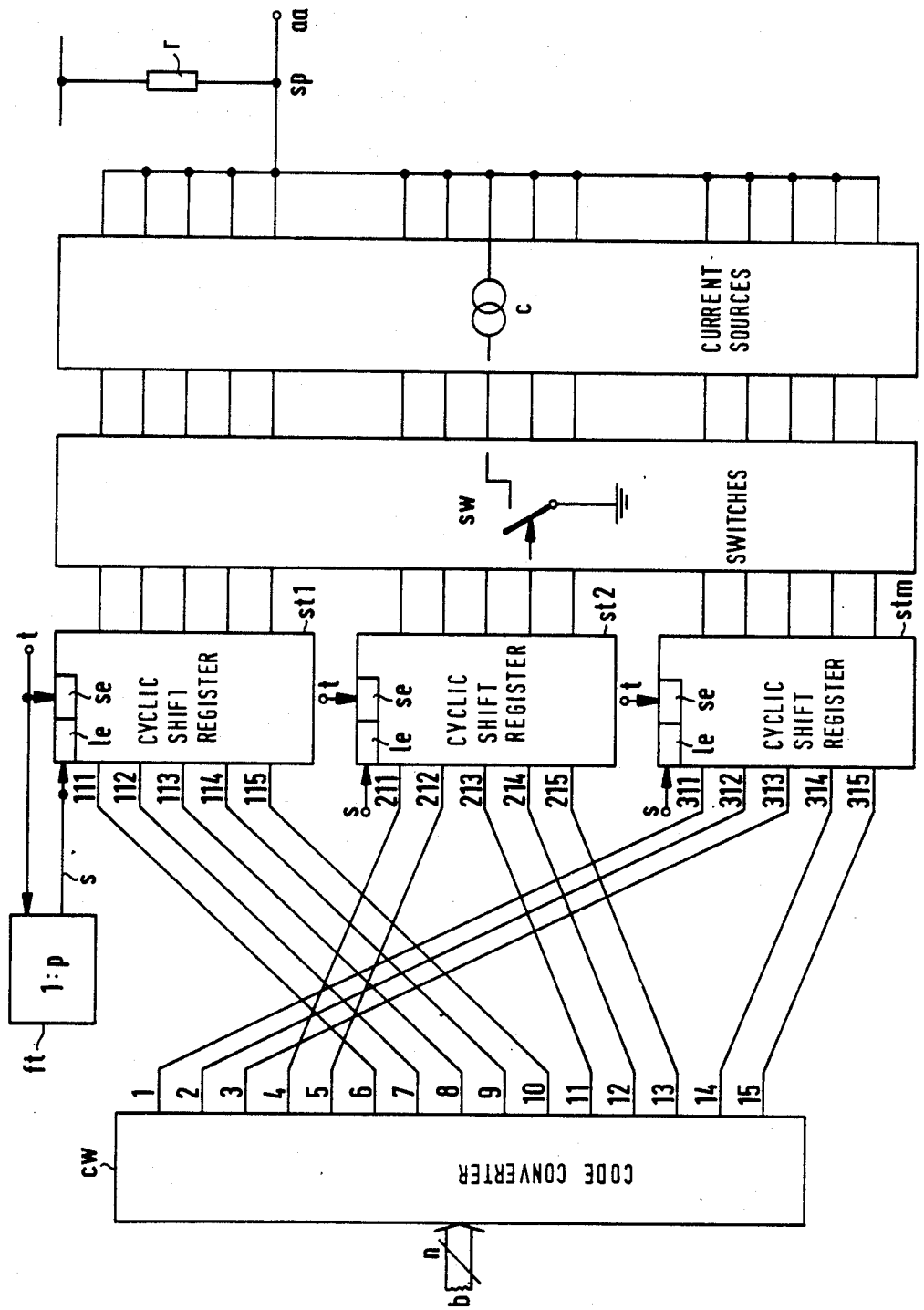

DIGITAL-TO-ANALOG CONVERTER WITH CYCLIC CONTROL OF CURRENT SOURCES

BACKGROUND OF THE INVENTION

1. Field of the Invention

The present invention is in the field of solid-state electronic circuits, and, more particularly, in the field of digital-to-analog converters using current sources.

2. Description of the Related Art

During monolithic integration of high-accuracy current sources for volume production of solid-state circuits, the problem arises that, because of the manufacturing variations of the current sources, the currents delivered by the latter are not exactly equal to one another. The current sources are implemented, for example, with the collector/emitter paths of bipolar transistors or the source/drain paths of, preferably insulated-gate, field-effect transistors of a so-called current bank, with the base or gate terminals, respectively, connected to a common constant potential.

According to Rudy van de Plassche, "Dynamic element matching puts trimless converters on chip," *Electronics*, June 16, 1983, pp. 130-134, and R.J.v.d. Plassche, "Monolithic 14-bit DAC with 85 dB S/N ratio," *ELECTRONIC COMPONENTS AND APPLICATIONS*, Vol. 2, No. 4, August 1980, pp. 235-241, the current inaccuracy of a 14-bit monolithic integrated digital-to-analog converter ("D/A converter") with bipolar transistors is largely compensated for by the use of a current divider and by switching the currents of a plurality of current sources to three current paths in a "rotating" manner by means of a cyclic shift register, with the first and second current paths being fed half the current of the third path. By cascading a plurality of such current dividers, a high-accuracy monolithic integrated D/A converter can be implemented.

The invention makes use of this principle of "dynamic element matching," as it is called in the above two references, but does not use the above-mentioned current divider of the prior art D/A converter. Rather, the present invention returns to the idea described in Applicant's non-prepublished European Patent Application No. 87 10 3742.0 (corresponding to U.S. patent application Ser. No. 07/074,205). Rather than using a binary signal to drive the "rotating" current sources, the binary signal is changed by means of a code converter into another coded binary signal which has a continuous sequence of states of the same kind. The instantaneous number of the states of the same kind is equal to the instantaneous value of the binary signal. The coded binary signal is caused to "rotate" by means of cyclic shift register, and the "rotating" signal drives a set of switches to turn the individual current sources on or off, or to switch them over.

The frequency of the shift signal for the shift register must be at least $(2^n-1)$ times higher than the frequency of the sampling signal at whose pulse repetition rate the binary signals occur. However, such a shift signal is not always available, e.g., because an oscillator of correspondingly stable frequency is too expensive for a specific application. In addition, the frequency of the shift signal often lies in ranges which necessitate a particularly careful design of, and specific manufacturing processes for, the integrated circuit.

SUMMARY OF THE INVENTION

Accordingly, the object of the invention as claimed is to modify the fundamental idea of the above-mentioned non-prepublished prior application in such a way that the frequency of the clock signal for the shift register can be considerably lower.

The invention starts from the fundamental idea that in most analog signals, especially in audio signals, amplitudes near the zero line occur much more frequently than amplitudes located away from this quiescent value, particularly maximum values. Since, in addition, most audio systems have an overload reserve, those values which correspond to the maximum possible positive and negative values of the analog signal practically never occur in the binary signal.

Based on this fundamental consideration, in accordance with the present invention, the shift register can be divided into cyclic shift register portions in which the frequency of the shift signal needs to be only that fraction of the multiple of the sampling signal frequency of the prior proposal which corresponds to the number of shift register portions. The latter must be driven from the output of the code converter in the manner set forth in the claim and explained below.

BRIEF DESCRIPTION OF THE DRAWINGS

The invention will now be explained in greater detail with reference to the sole figure of the accompanying drawing, which is a block diagram of an embodiment of the invention.

DETAILED DESCRIPTION OF THE PREFERRED EMBODIMENT

In the figure, a binary signal b is an n-bit signal and represents an audio signal, for example. The binary signal b is applied to a code converter cw. The code converter cw converts the binary signal b to a coded binary signal with a continuous sequence of a maximum of $2^n$ like states whose instantaneous number is equal to the instantaneous value of the binary signal b. The code of the coded binary signal is thus a pure counting code, in which the number of elements is equal to the number of states. Such a code is, for example, the so-called thermometer code, in which a continuous sequence of zeros or ones in the coded binary signal represents the instantaneous value of the binary signal b. Thus, when the 15 stage outputs 1...15 of the code converter cw are 1, as in the embodiment shown, the binary signal b, if present in the pure binary code, has the value 1111, which is equivalent to decimal 15. If the binary signal b has the value decimal 8, the outputs 1...8 are 1 (positive logic). If the outputs of the code converter were represented in negative logic, the outputs 1...8 would be 0.

In the embodiment shown in the figure, in which the number of outputs is odd, the output 8 is the middle output. If the number of outputs were even, there would be two adjacent middle outputs. If all the outputs up to the middle output are in the above-mentioned state of the same kind, i.e., if these outputs are all 0 or 1, this output state of the code converter cw can be regarded as a zero line or zero state of all output states representing the analog signal. As used herein, the position of an output refers to its logical position. For example, the output 2 is logically above the output 1 because the output 2 does not become active until the input binary signal b increases above the value required to activate the output 1, and the output 2 is logically below the output 3 since it becomes active before the output 3. Thus, in the example presented, the output 8 is the logical middle output since it does not become active until the outputs 1 through 7 have become active and it becomes active before the outputs 9 through 15 become active. An output is adjacent to another output if it becomes active one binary input value before or one binary input value after the other output.

The invention further includes a plurality of shift register portions st1, st2...stm. The embodiment shown in the figure is based on a concrete numerical example, namely that the number n of bits in the binary signal b is equal to 4, and that the number m of shift register portions st1, st2, stm is equal to 3, so that each shift register portion has $p=(2^n-1)/m = 5$ inputs.

From this, it follows that the frequency ratio between the sampling signal s, which represents the pulse repetition rate of the binary signals b, and the clock signal t, which serves as the shift signal for the shift register portions st1, st2, stm, is equal to the number p as well. To illustrate this relationship, the figure includes the frequency divider ft, which divides the frequency of the clock signal t by p to provide the sampling signal s, which is applied to the enable inputs 1e of the shift register portions st1, st2, stm. For reasons of clarity, the figure does not show that each shift register portion st is a cyclic register, i.e., that its serial input is connected to its serial output in a conventional manner.

According to the invention, the $2^n-1 = 15$ outputs 1...15 of the code converter cw are connected to the three groups of $p = 5$ stage inputs of the shift register portions st1, st2, stm as follows. The middle output 8 and the two adjacent outputs on both sides thereof, 6, 7 and 9, 10, i.e., a total of p adjacent outputs, comprise the first p outputs and are connected to the stage inputs 111...115 of the first shift register portion st1. A second p outputs are connected to the stage inputs 211...215 of the second shift register portion st2, and comprise a total of p code converter outputs on both sides of the first p outputs, namely the outputs 4, 5 and 11, 12, 13. According to the same interconnection law, the stage inputs 311...315 of the third and last shift register portion stm are connected to the remaining outputs 1, 2, 3 and 14, 15 of the code converter cw.

Through this inventive connection of the stage outputs 1...15 of the code converter cw with the stage inputs 111...115, 211...215 and 311...315 of the three shift register portions st1, st2, stm, the D/A converter exhibits its ideal linearity for those p output states of the code converter cw which are statistically most frequent. Only outside this range does it show a certain nonlinearity, which can be tolerated; however, since in the range in which small analog signals, e.g., low audio signals, occur, linearity is fully preserved.

To effect the above-mentioned "rotation," at the beginning of each period of the sampling signal s, which is applied to the enable inputs 1e of the shift register portions st, the instantaneous output state of the code converter cw is transferred into the shift register portions st1, st2, stm and "rotated" during that period. At the beginning of the next period, the next state is transferred and then "rotated."

The figure shows schematically that each stage output of the shift register portions st1, st2, stm has one of the switches sw associated therewith, which is followed by a current source c. The switches sw are opened or closed by the respective output signals from the shift register portions. Each switch is located at a suitable point of the current path of the associated current source, so that the respective current will be switched to or disconnected from the summing point sp or fed to or led off from the summing point.

Also shown schematically in the figure is the above-mentioned current bank of current sources c, whose currents all flow to the summing point sp as the analog output aa of the D/A converter. The summing point sp is connected to the potential of the supply voltage source through the resistor r shown.

If the number of shift register portions is such that the total number of stage inputs is greater than the number of outputs of the code converter cw, the excess stage inputs must be connected to a constant potential. That would be the case, for example, if there were 15 code converter outputs and four shift register portions with four inputs each, so that one input would be left, which would then have to be connected to the constant potential.

The D/A converter according to the invention is preferably realized using integrated circuit technology, particularly MOS technology. It can be part of a larger integrated circuit but can also be implemented as a separate integrated circuit.

I claim:

1. A digital-to-analog (D/A) converter for an n-digit input binary signal representing an analog signal which occurs at the pulse repetition rate of a sampling signal and which controls switches that selectively complete current paths that connect constant current sources with a summing point, said summing point providing an analog output, said D/A converter including a cyclic shift register having state outputs each driving one of the switches, said D/A converter comprising:

a code converter having an input that receives the input binary signal and that converts the input binary signal to a coded binary signal, the coded binary signal having a continuous sequence of a maximum $2^n$ like states, the instantaneous number of like states being equal to the instantaneous value of the input binary signal, the coded binary signal being provided as an output on $2^n-1$ output lines, said output lines being logically related such that an output line logically above a logically adjacent active output line is activated when the input binary signal is increased by one;

a cyclic shift register comprising m cyclic p-bit shift register portions to which a clock signal is applied as a shift signal, said shift signal having a frequency equal to p times the frequency of the sampling signal, each shift register portion having an enable input to which the sampling signal is applied, each shift register portion having a plurality of stage inputs, said stage inputs being connected to the output lines of said code converter as follows:

a first set of output lines, comprising at least one logically middle output line and a sufficient number of logically adjacent output lines on both sides of said logically middle output line to provide a total of p output lines, is connected to the inputs of the first shift register portion;

a second plurality of output lines, comprising a sufficient number of logically adjacent output lines on both logical sides of the first set of output lines to provide a total of p output lines in said second set of output lines, is connected to the stage inputs of the second shift register portion; and at least one additional set of output lines, comprising output lines on both logical sides of said second set of output lines, is connected to the mth shift register portion.

2. The digital-to-analog converter as defined in claim 1, wherein any remaining ones of the stage inputs of any of said shift register portions not connected to output lines of said code converter are connected to a constant potential.

3. The digital-to-analog converter as defined in claim 1, wherein said at least one middle output line has a number of output lines logically above it and an equal number of output lines logically below it.

* * * * *